(12) United States Patent
Ishio

(10) Patent No.: US 7,355,388 B2
(45) Date of Patent: Apr. 8, 2008

(54) ROTATION DETECTING DEVICE USING MAGNETIC SENSOR

(75) Inventor: Seiichiro Ishio, Kariya (JP)

(73) Assignee: DENSO CORPORATION, Kariya (JP)

(*) Notice: Subject to any disclaimer, the term of this patent is extended or adjusted under 35 U.S.C. 154(b) by 15 days.

(21) Appl. No.: 11/396,713

(22) Filed: Apr. 4, 2006

(65) Prior Publication Data
US 2006/0238190 A1  Oct. 26, 2006

(30) Foreign Application Priority Data
Apr. 21, 2005  (JP) .............. 2005-124061

(51) Int. Cl.
*G01B 7/30* (2006.01)
(52) U.S. Cl. .............. 324/207.21; 324/207.25
(58) Field of Classification Search ..............
324/207.12–207.25
See application file for complete search history.

(56) References Cited
U.S. PATENT DOCUMENTS 5,001,363 A * 3/1991 Anami ............ 327/62
5,637,995 A * 6/1997 Izawa et al. ............ 324/174
6,452,381 B1   9/2002 Nakatani et al.
6,580,269 B2 * 6/2003 Hiligsmann et al. ........ 324/251
6,930,477 B1   8/2005 Kurita et al.
2005/0225321 A1  10/2005 Kurumado

FOREIGN PATENT DOCUMENTS

| JP | A-62-66117 | 3/1987 |
|---|---|---|
| JP | A-62-661177 | 3/1987 |
| JP | A-7-333236 | 12/2005 |

* cited by examiner

*Primary Examiner*—Jay M Patidar
(74) *Attorney, Agent, or Firm*—Posz Law Group, PLC

(57) ABSTRACT

A rotation detecting device is provided that detects the rotation of a rotating object by means of a biasing permanent magnet and multiple sensor chips. The sensor chips are disposed on front and back sides of a mounting chip along the rotation direction of the rotating object, aligned with a line perpendicular to the direction or rotation of the rotating object, so as to convert magnetic vectors of a magnetic field to a plurality of sensor signals. A selection circuit is connected to the magnetoresistance sensors and selects the one of the sensor signals whose magnitude is the largest.

14 Claims, 6 Drawing Sheets

ROTATION DETECTING DEVICE USING MAGNETIC SENSOR

CROSS REFERENCE TO RELATED APPLICATION

The present application is based on and claims priority from Japanese Patent Application 2005-124061, filed Apr. 21, 2005, the contents of which are incorporated herein by reference.

BACKGROUND OF THE INVENTION

1. Field of the Invention

The present invention relates to a device for detecting rotation of a rotating object by magneto-resistance elements that are located in a biasing magnetic field.

2. Description of the Related Art

U.S. Pat. No. 6,452,381 B1 or JP-A-11-237256, which is a counterpart application of the U.S. patent, discloses such a rotation detecting device. This device includes a hollow biasing permanent magnet and a sensor chip on which a pair of magneto-resistance elements is formed. The sensor chip is inserted into the inside hollow portion of the permanent magnet so as to confront gear teeth formed at the periphery of a rotating object.

The magneto-resistance sensor is constituted of a pair of magneto-resistance elements formed on a sensor chip in such a shape of reversed V that the distance between the pair of sensor elements becomes shorter as they approach the gear teeth. Therefore, the resistance of one of the sensor elements changes differently from the other when the rotating object rotates. Because the sensor elements form into a half bridge circuit having a middle point, an electric output signal that changes as the rotation angle of the rotating object changes can be obtained from the middle point of the half bridge circuit. In other words, the potential of the middle point cyclically changes in response to the concave-convex portions of the gear teeth.

The resistance of the magneto-resistance sensor element changes when the magnetic vector of the biasing magnetic field provided by the permanent magnets changes. However, if the sensor chip is not correctly positioned relative to the gear teeth, the magnitude of change in the magnetic vector may become insufficient for the magneto-resistance sensor to provide sensor signals.

SUMMARY OF THE INVENTION

Therefore, an object of the invention is to provide an improved rotation detecting device that can provide sufficient magnitude of sensor signals without work for precisely positioning the sensor chip relative to the rotating object.

According to a feature of the invention, a rotation detecting device includes a biasing permanent magnet, plural magnetoresistance sensors and output circuit connected to the magnetoresistance sensors. The magneto resistance sensors are disposed along the rotation direction of the rotating object in parallel to each other to convert magnetic vectors of the magnetic field to a plurality of sensor signals, and, the output circuit provides a rotation signal based on a selected signal that are selected from the sensor signals.

Preferably, the selected signal has a largest magnitude of the sensor signals. Each of the magnetoresistance sensors may be constituted of a pair of magnetoresistance elements each of which is disposed to provide one of two component signals having phase reversed to the other. Therefore, each sensor signal corresponds to a difference between the two component signals. The output circuit preferably includes a selection circuit connected to the magnetoresistance sensors to select from the sensor signals one of the sensor signals whose magnitude is the largest. As a preferred embodiment, an elongated chip mount having surfaces that are perpendicular to the rotation axis of the rotating object is provided to hold the magnetoresistance sensors on the surfaces. The chip mount may be replaced with a lead frame for transmitting the rotation signal. The magnetoresistance sensors may be formed in two or more sensor chips. The biasing permanent magnet may have a hollow cylindrical shape so that the magnetoresistance sensors can be disposed inside the biasing permanent magnet. Further, a resinous mold member may be filled inside the biasing permanent magnet to cover and protect the magnetoresistance sensors.

According to another feature of the invention, the rotation detecting device may include a hollow cylindrical biasing permanent magnet magnetized to provide a biasing magnetic field toward the magnetic teeth of a rotation object, a pair of magnetoresistance sensors disposed inside the biasing permanent magnet in parallel with each other along the rotation direction of the rotating object and a selecting circuit for selecting from signals of the magnetoresistance sensors one of signals whose magnitude is larger than the other.

According to another feature of the invention, the rotation detecting device may include a hollow cylindrical biasing permanent magnet magnetized to provide a biasing magnetic field toward the magnetic teeth of the rotation object, a pair of sensor chips disposed inside said biasing permanent magnet in parallel with each other along the rotation direction of the rotating object, a selection circuit for selecting from the sensor signals of the sensors formed at corresponding positions on the pair of sensor chips a selected pair of the sensor signals whose magnitude is larger than the other; and a calculation circuit for calculating a difference between the selected pair of sensor signals.

According to a further feature of the invention, the rotation detecting device includes a hollow cylindrical biasing permanent magnet magnetized to provide a biasing magnetic field extending toward the magnetic teeth of the rotation object, a plurality of magnetoresistance sensors disposed inside the biasing permanent magnet in parallel with each other along the rotation direction of the rotating object and a selection circuit for selecting from signals of the magnetoresistance sensor one signal whose magnitude is the largest.

BRIEF DESCRIPTION OF THE DRAWINGS

Other objects, features and characteristics of the present invention as well as the functions of related parts of the present invention will become clear from a study of the following detailed description, the appended claims and the drawings. In the drawings:

DETAILED DESCRIPTION OF THE PREFERRED EMBODIMENTS

Some preferred embodiments of the present invention will be described with reference to the appended drawings.

A rotation detecting device 100 according to the first embodiment of the invention will be described with reference to FIGS. 1-3.

Figure 1:
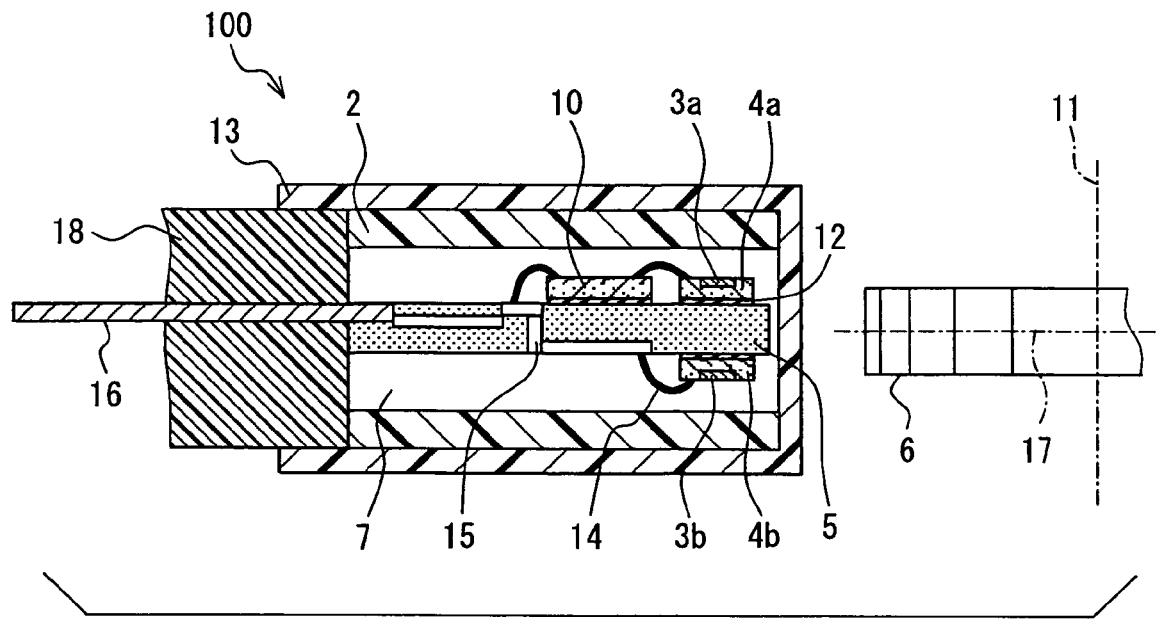
FIG. 1 is a longitudinal cross-sectional view of a rotation detecting device according to the first embodiment of the invention.

As shown in FIG. 1, the rotation detecting device 100 includes a biasing permanent magnet 2, a pair of magnetoresistance sensors 3a and 3b respectively formed on sensor chips 4a and 4b, a chip mount 5, a circuit chip 10, a cylindrical cover 13, wires 14, a terminal 15, a lead frame 16 and a cap member 18. The rotation detecting device 100 is disposed to confront a rotor or rotating object 6, which is a gear-like magnetic member having teeth along its periphery and a rotation axis 11 at its center.

The biasing permanent magnet 2 provides a biasing magnetic field that extends to the rotor 6. The biasing permanent magnet 2 is made of a bonded composite of magnet powder and organic binder. The magnetic powder preferably includes rare earth powder. The biasing permanent magnet 2 may be a ferrite permanent magnet or other sintered permanent magnet. The biasing permanent magnet 2 is formed by means of compression molding or injection molding to have a hollow cylindrical shape that has a hollow portion 7. The biasing permanent magnet 2 is magnetized so that an N-pole is formed at one of the axial ends thereof near the rotor 6 and an S-pole at the other end. However, the biasing permanent magnet 2 may be magnetized in the other direction.

The magnetoresistance sensors 3a, 3b have magnetic anisotropy. The sensor chips 4a, 4b provide electric signals related to the magnetic resistances of the magnetoresistance sensors 3a, 3b. The sensor chips 4a, 4b are covered with or packaged in a resinous material.

The chip mount 5 is an elongated member that has front and back surfaces extending along the rotation direction of the rotating object 6 or in the direction perpendicular to the rotating axis 11 of the rotor 6. The sensor chips 4a, 4b are respectively fixed to the front and back surfaces of the chip mount 5 by adhesive bond 12.

Figure 2A:
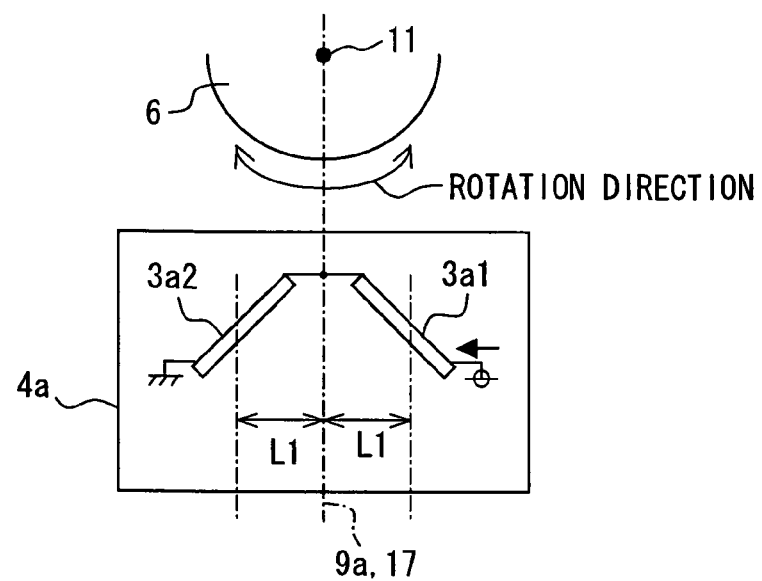
FIG. 2A is a plan view of the rotation detecting device according to the first embodiment.
Figure 2B:
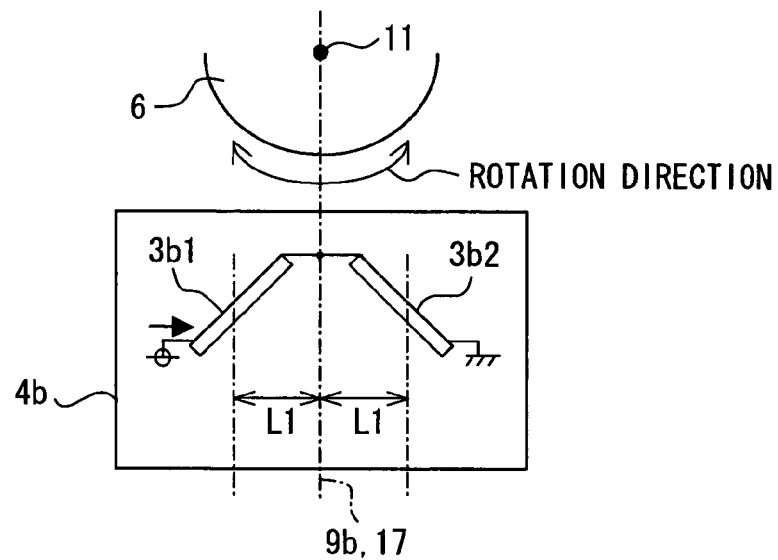
FIG. 2B is a bottom view thereof.
Figure 2C:
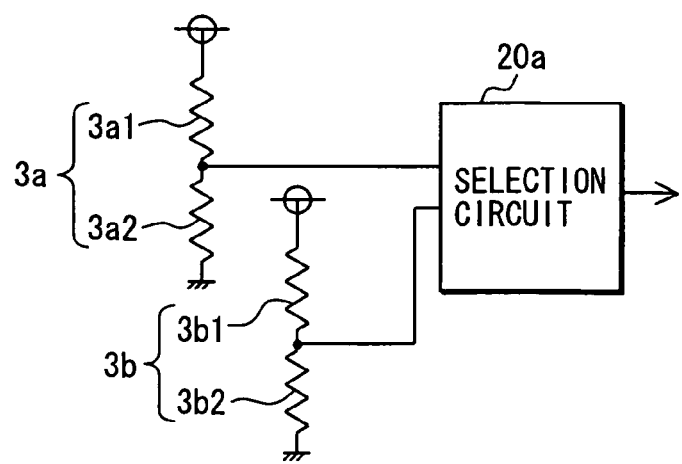
FIG. 2C is a circuit diagram of the rotation detecting device according to the first embodiment.

The circuit chip 10 includes a selection circuit 20a, which is shown in FIG. 2C, and receives electric signals from the sensor chips 4a, 4b via the wires 14 and the terminal 15. The selection circuit 20a selects one of the electric signals that has a larger power and sends the selected signal outside via the lead frame 16. The cylindrical cover 13 is a magnetic member that has an opening at one end and a bottom at the other end. The opening is closed by the cap member 18, which is made of an insulating material, after the biasing permanent magnet 2 is held in the inside of the cover 13.

As shown in FIGS. 1, 2A and 2B, the sensor chips 4a, 4b are disposed on the surfaces of the chip mount 5 so that the respective center lines 9a, 9b of the sensor chips 4a, 4b can be positioned on the magnetic center line 17 of the biasing permanent magnet 2.

The magnetoresistance sensors 3a, 3b are made of nickel-cobalt alloy or nickel-iron alloy, which are vapor-deposited on the sensor chips 4a, 4b to form thin films extending along the rotation direction of the rotating object.

As shown in FIGS. 2A, 2B and 2C, the magnetoresistance sensor 3a is constituted of a pair of series-connected magnetoresistance elements 3a1, 3a2, and the magnetoresistance sensors 3b is constituted of a pair of series-connected magnetoresistance elements 3b1, 3b2. Each of the magnetoresistance elements 3a1, 3a2, 3b1, 3b2 has the same length. The magnetoresistance elements 3a1, 3a2 are formed on the sensor chip 4a in a shape of reversed V so that the extensions thereof can cross the magnetic center line 17 at an angle of 45° and cross each other at an angle of 90°. The magnetoresistance elements 3b1, 3b2 are also formed on the sensor chip 4b in a shape of reversed V so that the extensions thereof can cross the magnetic center line 17 at an angle of 45° and cross each other at an angle of 90°.

Figure 3:
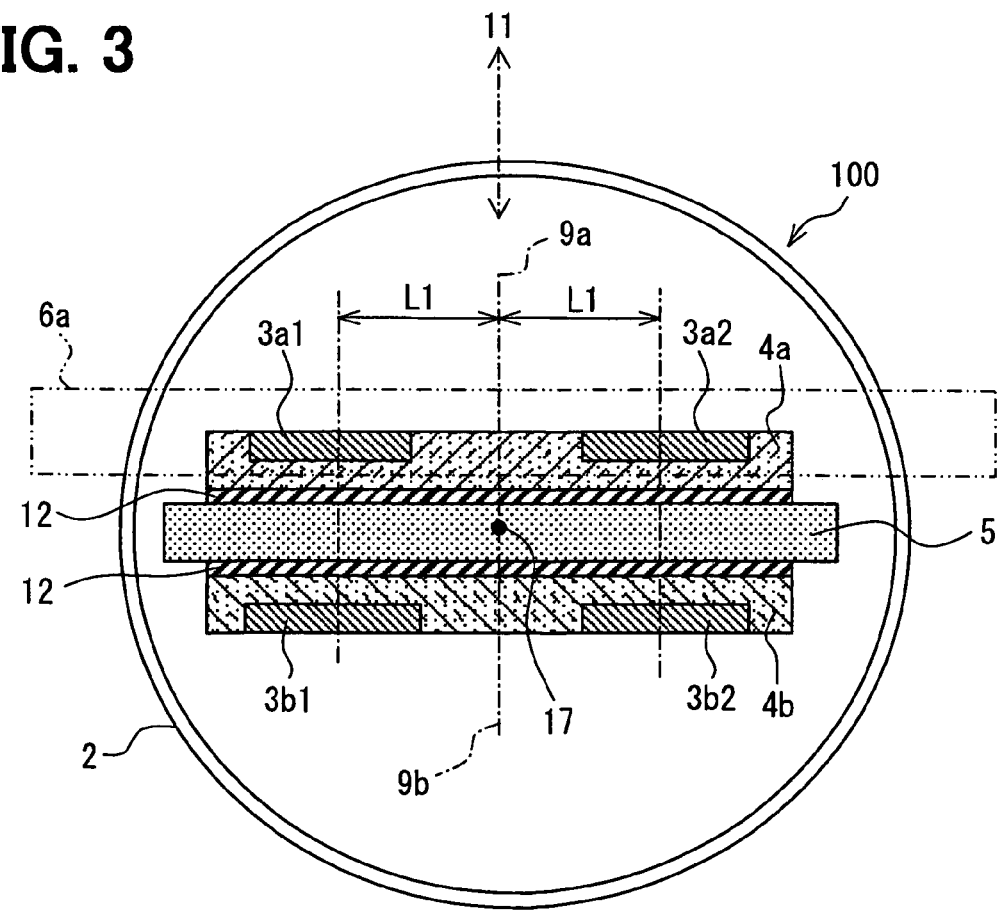
FIG. 3 is a cross-sectional view of the rotation detecting device viewed from a rotating object.

As shown in FIG. 3, the biasing permanent magnet 2 has a hollow cylindrical shape, and the sensor chips 4a, 4b are respectively fixed to the front and back surfaces of the chip mount 5 disposed inside the permanent magnet 2 so as to face opposite directions that are in parallel with the rotating axis 11 of the rotor 6. In other words, the sensor chips 4a, 4b are disposed in parallel with each other inside the permanent magnet along the rotation direction of the rotor 6.

Accordingly, the rotation of the rotor 6 can be detected without very accurate position of the sensor chips 4a, 4b relative to the rotor 6. Even if the position of the rotor 6 relative to the sensor chips 4a, 4b shifts from the center line between the sensor chips 4a, 4b to the side of the sensor chip 4a as shown by a two-dot line 6a in FIG. 3, the distance between the sensor chip 4a and the rotor 6 does not change very much, so that the sensor chip 4a can still detect sufficient magnitude of magnetic vector when the rotor 6 rotates although the sensor chip 4b cannot.

For the above purpose, the circuit chip 10 includes a selection circuit 20a, which is connected to the magnetoresistance sensors 3a, 3b, as shown in FIG. 2C, to select a larger magnitude of the output signals of the elements 3a, 3b. The magnitude may be detected based on a range defined by the maximum and the minimum of the output signals.

Each of the magnetoresistance sensors 3a, 3b may be constituted of a full bridge of four magnetoresistance elements to increase sensing accuracy of the rotation detecting device 100.

Figure 4:
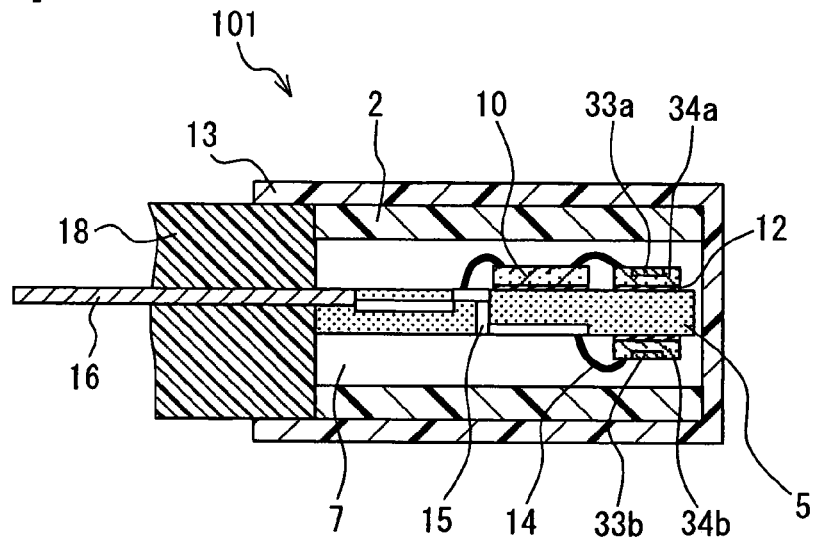
FIG. 4 is a longitudinal cross-sectional view of a rotation detecting device according to the second embodiment of the invention.

A rotation detecting device 101 according to the second embodiment of the invention will be described below with reference to FIGS. 4-6. Incidentally, the same reference numeral indicates the same or substantially the same portion, part or component as the rotation detecting device according to the first embodiment.

Figure 5A:
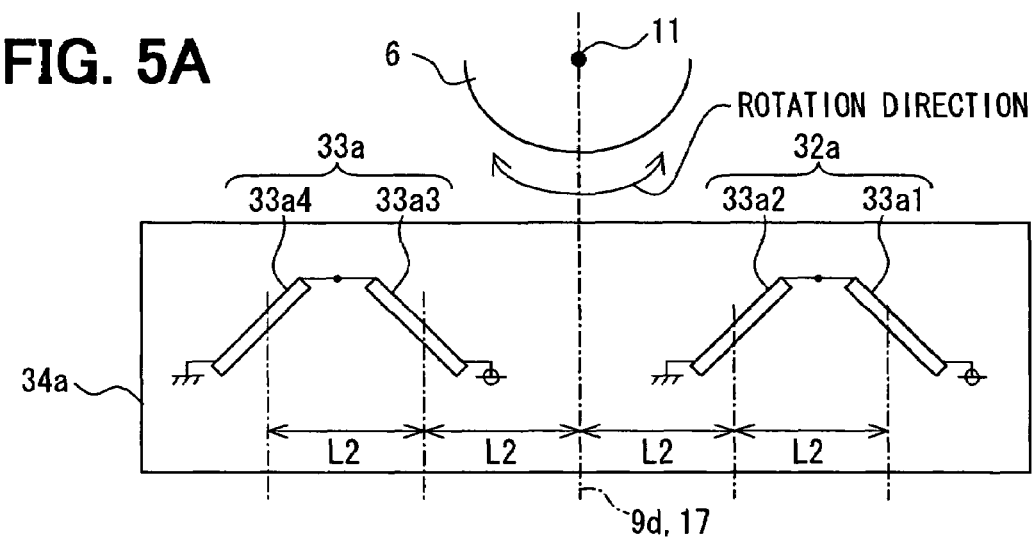
FIG. 5A is a schematic plan view of the rotation detecting device according to the second embodiment.
Figure 5B:
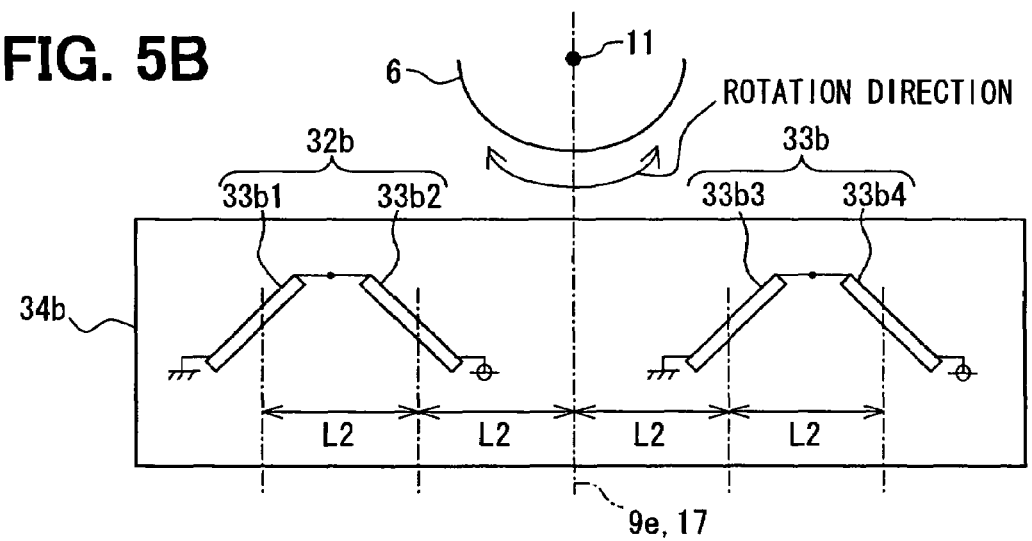
FIG. 5B is a schematic bottom view of the same.
Figure 5C:
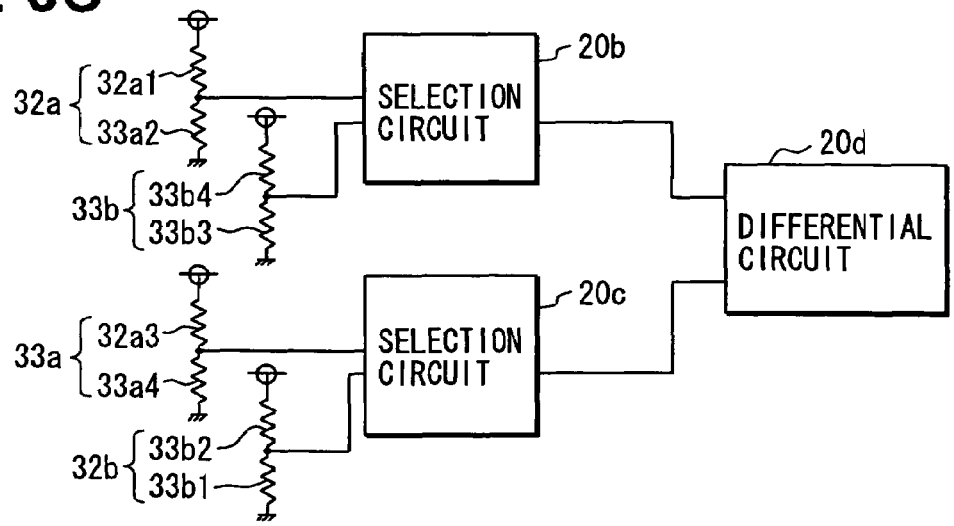
FIG. 5C is a circuit diagram of the rotation detecting device according to the second embodiment.

As shown in FIGS. 5A, 5B, and 5C, each of a pair of sensor chips 34a, 34b is disposed along the rotation direction of the rotor 6 and has a pair of magnetoresistance sensors 32a, 33a (or 32b, 33b), each of which has a pair of series-connected magnetoresistance elements 33a1 and 33a2 (or 33a3 and 33a4, 33b1 and 33b2, or 33b3 and 33b4).

Each of the eight magnetoresistance elements (33a1, 33a2, 33a3, 33a4, 33b1, 33b2, 33b3 and 33b4) has the same length.

The sensor chip 34a is positioned relative to the rotor 6 so that its center line 9d can be positioned on the magnetic center line 17 of the biasing magnetic field, and the magnetoresistance sensors 32a and 33a are positioned in symmetric with each other with respect to the center line 9d. The sensor chip 34b is also positioned relative to the rotor 6 so that its center line 9e can be positioned on the magnetic center line 17, and the magnetoresistance sensors 32b and 33b are positioned in symmetric with each other with respect to the center line 9e.

The magnetoresistance elements 33a1, 33a2 are formed on the sensor chip 34a in a shape of reversed V so that the extensions thereof can cross the magnetic center line 17 at an angle of 45° and cross each other at an angle of 90°. Other pairs of magnetoresistance elements are also formed on the respective sensor chips 34a, 34b in the same shape of reversed V. Therefore, the output signal of the sensor 32a and the output signals of the sensor 33a are reversed in phase to each other, and the output signal of the sensor 32b and the output signals of the sensor 33b become reversed in phase to each other.

Figure 6:
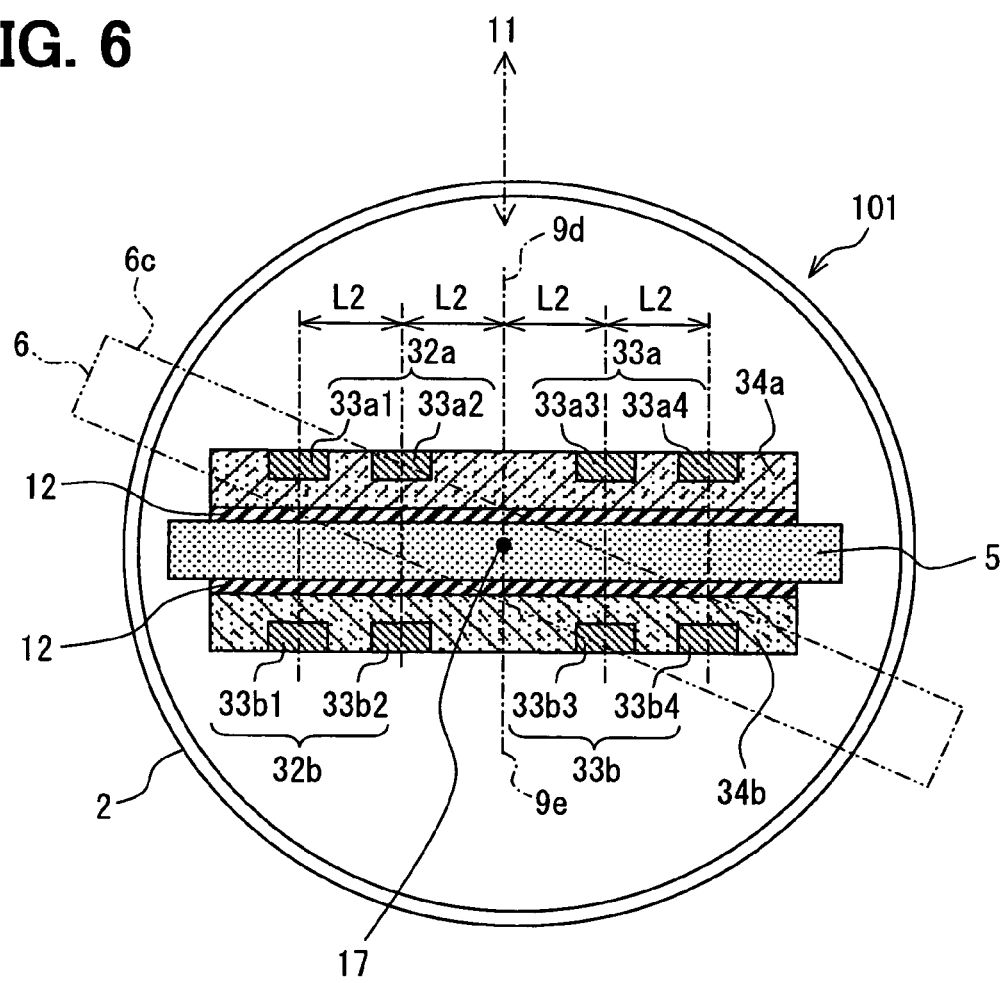
FIG. 6 is a cross-sectional view of the rotation detecting device according to the second embodiment viewed from a rotating object.

As shown in FIG. 6, the sensor chips 34a, 34b are fixed to the front and back surfaces of the chip mount 5 to extend perpendicular to the rotating axis 11 of or along the rotation direction of the rotor 6. In other words, the magnetoresistance sensors 32a, 33a of the sensor chip 34a are disposed in parallel with the magnetoresistance sensors 32b, 33b of the sensor chip 34b along the rotation direction of the rotor 6.

As shown in FIG. 5C, the circuit chip 10 includes a pair of selection circuits 20b, 20c and a differential circuit 20d. The selection circuits 20b receives electric signals from the magnetoresistance sensor 32a (front-right in view of FIG. 5A) and the magnetoresistance sensor 33b (rear-right). The selection circuit 20c receives electric signals from the magnetoresistance sensor 33a (front left) and the magnetoresistance sensor 32b (rear left). Each of the selection circuits 20b, 20c respectively selects such one of the two electric signals of the magnetoresistance sensors, disposed on the same side of the chip mount along the rotation direction of the rotor 6, that has a larger magnitude. The selection circuits 20b, 20c send the selected signals to an outside circuit via a lead frame.

If the plane 6c of the rotation of the rotor 6 leans, as shown by a two-dot-chain line in FIG. 6, the selection circuit 20b selects the electric signal from the front left magnetoresistance sensor 32a, and the selection circuit 20c selects the electric signal from the rear right magnetoresistance sensor 33b. Therefore, the sensor chips 34a, 34b can still detect sufficient magnitude of magnetic vector even if the rotor 6 leans, so that the difference between the electric signals from the sensor chips 34a and 34b is provided by the differential circuit 20d.

Figure 7:
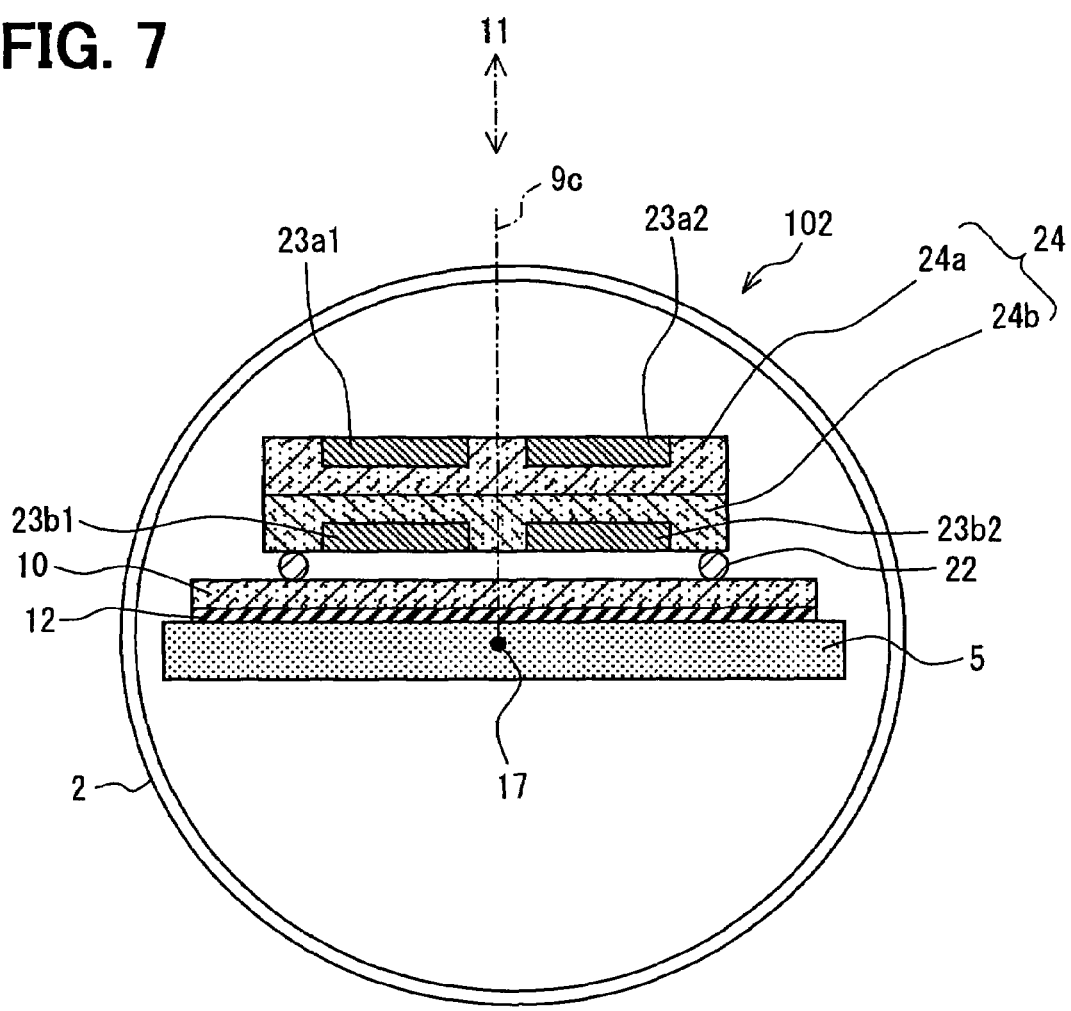
FIG. 7 is a cross-sectional view of the rotation detecting device according to the third embodiment viewed from a rotating object.

A rotation detecting device 102 according to the third embodiment of the invention will be described below with reference to FIG. 7.

A sensor chip 24 is held on the circuit chip 10 via a bump 22. The sensor chip 24 is constituted of a pair of chip plates 24a, 24b on which magnetoresistance elements 23a, 23b are respectively formed in the same manner as the magnetoresistance elements 3a, 3b described above relating to the first embodiment. The sensor chip 24 may be replaced with a pair of sensor chips 34a, 34b of the second embodiment.

Figure 8:
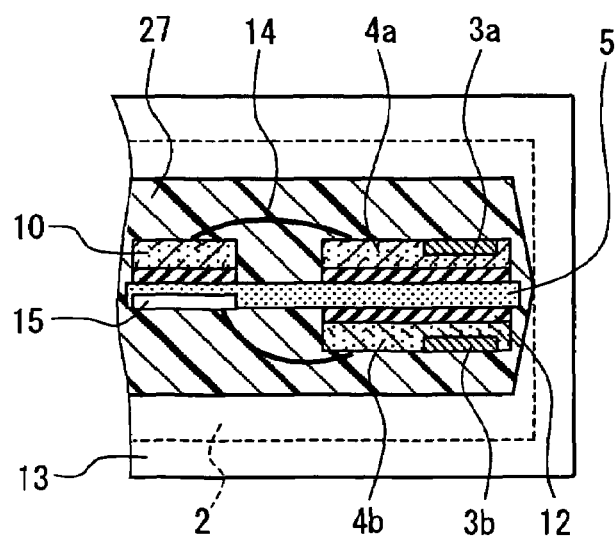
FIG. 8 is a fragmentary cross-sectional view of a modification of the above rotation detecting devices.

As a modification of the above-described embodiments, the sensor chips 4a, 4b and the circuit chip 10 may be covered with a resinous material 27 such as polyphenilene sulfide (PPS) or epoxy resin, as shown in FIG. 8, in order to prevent the rotation detecting device from being affected by water, dust and/or vibration.

Figure 9A:
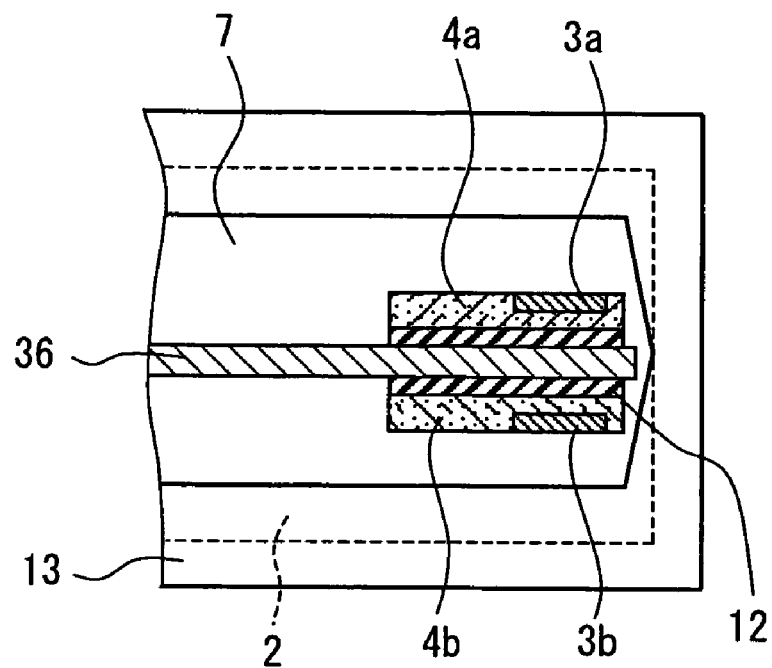
FIG. 9A is a fragmentary cross-sectional view of a modification of the above rotation detecting devices.
Figure 9B:
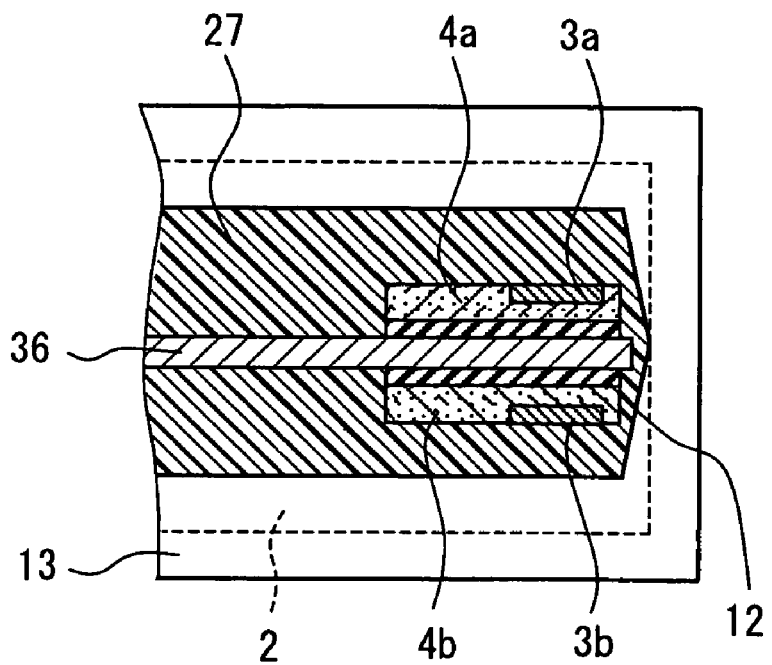
FIG. 9B is a fragmentary cross-sectional view of a further modification of this rotation detecting device.

Further, the chip mount 5 can be replaced with a lead frame 36, as shown in FIG. 9A. The sensor chips 4a, 4b and the lead frame 36 may be covered with a resinous material 27 such as polyphenilene sulfide or epoxy resin, as shown in FIG. 9B.

In the foregoing description of the present invention, the invention has been disclosed with reference to specific embodiments thereof. It will, however, be evident that various modifications and changes may be made to the specific embodiments of the present invention without departing from the scope of the invention as set forth in the appended claims. Accordingly, the description of the present invention is to be regarded in an illustrative, rather than a restrictive, sense.

What is claimed is:

1. A rotation detecting device for detecting rotation of a rotating object, comprising:
    a biasing permanent magnet for providing a biasing magnetic field that extends toward the rotating object;
    a chip mount, having front and back surfaces, that extends along a rotation direction of the rotating object;
    one or more sensor chip pairs formed on the chip mount, for converting magnetic vectors of the magnetic field to a plurality of sensor signals; and
    output means, connected to said sensor chips, for outputting a rotation signal based on a selected signal that is selected from the plurality of sensor signals,
    wherein each of the one or more sensor chip pairs includes a first sensor chip formed on the front surface of the chip mount and a second sensor chip formed on the back surface of the chip mount, and
    wherein the sensor chip pairs are collectively aligned with a line perpendicular to the rotation direction.

2. The rotation detecting device as claimed in claim 1, wherein the selected signal has a largest magnitude of the plurality of sensor signals.

3. The rotation detecting device as claimed in claim 2, wherein:
    each of said sensor chips comprises a pair of magnetoresistance elements that extend along the rotation direction of the rotating object, each of which is disposed to provide one of two component signals having phase reversed to each other, thereby providing a difference between the two component signals as one of the sensor signals.

4. The rotation detecting device as claimed in claim 1, wherein said chip mount is a lead frame for transmitting the rotation signal.

5. The rotation detecting device as claimed in claim 1, wherein:
    said biasing permanent magnet has a hollow cylindrical shape; and
    said sensor chips are disposed inside said biasing permanent magnet.

6. The rotation detecting device as claimed in claim 5, further comprising a resinous mold member filled inside said biasing permanent magnet to cover said magnetoresistance sensors.

7. The rotation detecting device as claimed in claim 1, wherein the rotating object is a gear-like magnetic member having teeth on its peripheral portion.

8. A rotation detecting device for providing a rotation signal relating to rotation of a rotating object via magnetic teeth formed around the periphery thereof, said rotation detecting device comprising:

a hollow cylindrical biasing permanent magnet magnetized to provide a biasing magnetic field toward the magnetic teeth of the rotation object;

first and second sensor chips, disposed inside said biasing permanent magnet along the rotation direction of the rotating object, for providing first and second sensor signals, respectively; and means for selecting one of the first and second sensor signals whose magnitude is larger than the other, wherein the first sensor chip is disposed on a first plane, and the second sensor chip is disposed on a second plane that is separate from but parallel to the first plane, and wherein the first and second sensor chips are aligned with a line perpendicular to the rotation direction.

9. The rotation device as claimed in claim 8, wherein each of said sensor chips includes a pair of series-connected magnetoresistance elements each of which is disposed to provide a component signal having phase reversed to the other, thereby providing a difference between the two component signals as one of the sensor signals.

10. The rotation device as claimed in claim 9, wherein said means for selecting comprises a selection circuit connected to said sensor chips.

11. A rotation detecting device for providing a rotation signal relating to rotation of a rotating object via magnetic teeth formed around the periphery thereof, said rotation detecting device comprising:

a hollow cylindrical biasing permanent magnet magnetized to provide a biasing magnetic field toward the magnetic teeth of the rotation object;

a pair of sensor chips, respectively disposed inside said biasing permanent magnet on a pair of separate planes extending in parallel with each other along a rotation direction of the rotating object, each of said sensor chips including a plurality of magnetoresistance sensors formed thereon at different positions in parallel to each other so that each sensor chip provides a pair of sensor signals; and means for selecting from the sensor signals of said sensors formed at corresponding positions on the pair of sensor chips a selected pair of the sensor signals whose magnitude is larger than the other; and means for calculating a difference between the selected pair of sensor signals, wherein the pair of sensor chips are each aligned with a line perpendicular to the rotation direction.

12. The rotation detecting device as claimed in claim 11, wherein each of said sensor chips comprises a pair of series-connected magnetoresistance elements, each of said magnetoresistance elements being disposed to provide a component signal having phase reversed to the other to provide a difference between the two component signals as one of the sensor signals.

13. A rotation detecting device for providing a rotation signal relating to rotation of a rotating object via magnetic teeth formed around the periphery thereof, said rotation detecting device comprising:

a hollow cylindrical biasing permanent magnet magnetized to provide a biasing magnetic field extending toward the magnetic teeth of the rotation object;

a pair of sensor chips respectively disposed inside said biasing permanent magnet on a pair of separate planes extending in parallel with each other along the rotation direction of the rotating object, for providing a plurality sensor signals; and means for selecting from the sensor signals one of the plurality of sensor signals whose magnitude is the largest.

14. The rotation detecting device as claimed in claim 13, wherein each of said sensor chips comprises a pair of series-connected magnetoresistance elements, each of said magnetoresistance elements being disposed to provide a component signal having phase reversed to the other to provide a difference between the two component signals as one of the sensor signals.

* * * * *